US007784177B2

(12) United States Patent
Back et al.

(10) Patent No.: US 7,784,177 B2
(45) Date of Patent: Aug. 31, 2010

(54) METHOD OF MANUFACTURING AN IMAGE DRUM

(75) Inventors: Kae Dong Back, Yongin-si (KR); Ki Deok Bae, Yongin-si (KR); Chang Youl Moon, Suwon-si (KR); Kyu Ho Shin, Seoul (KR); Soon Cheol Kweon, Seoul (KR); Won Kyoung Choi, Suwon-si (KR); Chang Seung Lee, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1121 days.

(21) Appl. No.: 11/447,256

(22) Filed: Jun. 6, 2006

(65) Prior Publication Data

US 2007/0137776 A1 Jun. 21, 2007

(30) Foreign Application Priority Data

Dec. 19, 2005 (KR) ..................... 10-2005-0125203

(51) Int. Cl.
*H05K 3/02* (2006.01)
*B41J 2/39* (2006.01)

(52) U.S. Cl. .......................... 29/846; 29/825; 264/104; 347/141

(58) Field of Classification Search .................. 29/825, 29/846; 264/104; 347/141
See application file for complete search history.

(56) References Cited

U.S. PATENT DOCUMENTS

2009/0215208 A1 * 8/2009 Coe-Sullivan et al. ......... 438/22

FOREIGN PATENT DOCUMENTS

JP 5-27761 4/1993
JP 6-206340 7/1994

* cited by examiner

*Primary Examiner*—C. J Arbes
(74) *Attorney, Agent, or Firm*—Sughrue Mion, PLLC

(57) ABSTRACT

An image drum manufacturing method including: providing a hollow cylindrical mold having a plurality of mold grooves circumferentially cut in its inner circumferential surface and a core portion having a smaller diameter than a hollow of the mold and having a slit-shaped combination groove; filling a conductive material into the mold grooves of the mold; inserting a control unit for individually applying a voltage to each terminal in the combination groove of the core portion, so that a conductive pattern corresponding to the conductive material is partially exposed; inserting the core portion into the mold so that the conductive pattern corresponds to the conductive material filled into each mold groove; and forming a drum body to be integrally formed with the control unit and the conductive material by filling a molten plastic into a space between the mold and the core portion.

14 Claims, 14 Drawing Sheets

METHOD OF MANUFACTURING AN IMAGE DRUM

CROSS-REFERENCE TO RELATED APPLICATION

This application claims priority from Korean Patent Application No. 10-2005-0125203, filed on Dec. 19, 2005, in the Korean Intellectual Property Office, the disclosure of which is incorporated herein by reference.

BACKGROUND OF THE INVENTION

1. Field of the Invention

The present invention relates to an image drum for use in a printing apparatus, and more particularly, to an image drum and a method of manufacturing the same, in which an image drum including a ring conductor can be easily fabricated and a manufacturing cost can be reduced.

2. Description of Related Art

FIG. 1 is a perspective view illustrating a conventional image-forming element according to a conventional art, and FIG. 2 is a partially enlarged cross-sectional view illustrating a portion of the circumferential wall of the image-forming element according to the conventional art. The image-forming element shown in FIGS. 1 and 2 is disclosed in U.S. Pat. No. 6,014,157 by reference.

Referring to FIGS. 1 and 2, a conventional image-forming element 10 includes a hollow cylindrical drum body 12 which is made of metal, preferably aluminum or an aluminum alloy. A plurality of circumferentially extending electrodes 14 are formed on the outer circumferential surface of the drum body 12. These electrodes 14 are electrically insulated from one another and from the drum body 12 and are covered by a thin layer of insulating material. The electrodes 14 may generally be designed depending on the desired resolution of the images to be formed, but are preferably provided densely over the whole length of the drum body 12 to be arranged with a pitch of, for example, about 40 μm in order to realize a resolution of approximately 600 dots per inch (dpi).

An elongate-shaped control unit 16 is mounted inside of the hollow drum body 12 such that a terminal array 18 formed at a longitudinal edge of the control unit 16 adjoins the internal wall of the drum body 12. The control unit 16 is arranged for individually applying a suitably high voltage to each of the electrodes 14 via the terminal array 18 in accordance with the image formation. As shown in FIG. 2, the individual electrodes 14 are formed as grooves separated by adjacent insulating ridges 20 and are filled internally with electrically conductive material 32. Since the electrically conductive material 32 fills in a small diameter hole 24 and a large diameter hole 26 constituting a through-hole 22, the electrodes 14 are electrically connected to zebra-strips 36 disposed at the inner wall surface of the drum body 12 via the through-hole 22. In this case, an anodized surface layer 34 is present at the outer circumferential surface of the drum body 12 and at the internal wall of the through-holes so as to electrically insulate the drum body 12 and the electrodes 14 from each other.

In order to manufacture the image-forming element 10, the cylindrical drum body 12 is provided. The grooves are cut into the outer circumferential surface of the drum body 12, for example by means of a diamond chisel to have a pitch of approximately 40 μm and a width of approximately 20 μm to form the electrodes 14. Alternatively, these grooves may be formed on the outer circumferential surface of the drum body 12 by means of a laser beam or an electron beam.

In the next step, the large diameter holes 26 are cut into the wall of the drum body 12 from inside by, for example, a laser beam. The small diameter holes 24 may also be formed with a laser beam, either from the inside or outside of the drum body 12 to thereby form the through-holes 22. After the through-holes 22 including the small diameter holes 24 and the large diameter holes 26 have been formed, the whole drum body 12 is anodized so as to form the insulating metal oxide layer 34 on the whole surface of the drum body 12. Thereafter, the electrically conductive material 32 fills in the grooves and the through-holes 22. The outer or inner circumferential surface of the drum body 12 is cut to a predetermined depth through polishing so as to effectuate the electrodes 14 and electrical connection portions inside of the through-holes 22. An insulating layer is formed on the outer circumferential surface of the drum body 12 and the control unit 16 is disposed inside of the drum body 12 so as to complete the manufacture of the image-forming element 10.

As described above, in order to form the electrodes 14 on the outer circumferential surface of the drum body 12, the grooves are densely formed over the whole length of the drum body 12 using a precise cutting tool and the through-holes 22 must be formed at regular intervals either from the inside or outside of the drum body 12. Also, after the formation of the anodized surface layer on the outer circumferential surface of the drum body 12 and at the internal wall of the through-holes 22, the electrically conductive material 32 is filled into the grooves and the through-holes 22 and is removed until a desired thickness remains. Specifically, since it is very difficult to evenly form the grooves on the outer circumferential surface of the drum body 12 in such a fashion as to have a pitch of approximately 40 μm and a width of approximately 20 μm and to fabricate the through-holes 22, a manufacturing cost of the image-forming element 10 is significantly high and defect regularly occur. However, the conventional image-forming method and apparatus entails a problem in that a printer made by using such a method and apparatus is expensive, which makes it difficult to sell the printer. As discussed in detail below, there is presently disclosed a direct induction type image-forming method and apparatus using a ring conductor such as the image-forming element described above.

SUMMARY OF THE INVENTION

Additional aspects and/or advantages of the invention will be set forth in the description which follows and in the accompanying drawings. Illustrative, non-limiting embodiments of the present invention overcome the above disadvantages and other disadvantages not described above. Also, the present invention is not required to overcome the disadvantages described above, and an illustrative, non-limiting embodiment of the present invention may not overcome any of the problems described above The present invention provides an image drum which can reduce the complexity of a conventional manufacturing process and also decrease the manufacturing cost by forming ring electrodes on the outer circumferential surface of a drum body through injection molding, in a shape to include a control unit in the drum body, and a method of manufacturing the image drum.

The present invention also provides an image drum which can form a control unit by using a printed circuit board (PCB) or a flexible printed circuit board (FPCB), electrically connect a conductive pattern with each of the ring electrodes, and individually apply a voltage to each terminal and control the voltage of the ring electrodes, and a method of manufacturing the image drum.

The present invention also provides an image drum which can integrally form gears in both ends of a drum body by injection molding and reduce a manufacturing process, and a method of manufacturing the image drum.

According to an aspect of the present invention, an image drum manufacturing method provides a hollow cylindrical mold having a plurality of mold grooves circumferentially cut in its inner circumferential surface and a core portion having a smaller diameter than a hollow of the mold and having a slit-shaped combination groove.

After this, a conductive material fills in the mold grooves of the mold. In this instance, the conductive material may be an electrically conductive metal. According to another aspect of the present invention, in addition to a metal, another electrically conductive material may be utilized. As an example, a silver paste or a conductive polymer may be utilized.

Also, a control unit is inserted into the combination groove such that the control unit is partially exposed to an outside of the core portion. In this instance, the control unit is exposed according to the difference in size between the core portion and the hollow of the mold. Also, the control unit individually applies a voltage to each terminal, and is formed in the mold groove and controls each ring electrode which is made of a conductive material.

The core portion is inserted into the mold after coupling the control unit with the combination groove. The core portion is positioned to closely adhere an end of the control unit to the mold groove.

The drum body is formed to receive the control unit by initially inserting the core portion into the mold and subsequently filling a molten plastic into an opening (a space) between the mold and the core portion.

In order to form ring electrodes on the outer circumferential surface of a conventional drum body, grooves are densely formed over the whole length of the drum body using a precise cutting tool and through-holes must be formed at regular intervals either from the inside or outside of the drum body. Also, after the formation of the anodized surface layer on the outer circumferential surface of the drum body and at the internal wall of the through-holes, an electrically conductive material is filled into the grooves and the through-holes and is removed until a desired thickness remains. Specifically, since it is very difficult to evenly form the grooves on the outer circumferential surface of the drum body to have a pitch of approximately 40 μm and a width of approximately 20 μm and to fabricate the through-holes in the conventional method, a manufacturing cost of an image-forming element is significantly high and defects regularly occur. As mentioned above, there is presently disclosed a direct induction type image-forming method and apparatus using a ring conductor such as the image-forming element as described above. However, the conventional image-forming method and apparatus entails a problem in that a printer made by using such a method and apparatus is expensive, which may make it difficult to sell the printer.

However, an image drum manufacturing method according to the present invention forms ring electrodes by filling a conductive material into mold grooves which are circumferentially cut in an inner circumferential surface of a mold, and provides the ring electrodes on an outer circumferential surface of a drum body. Accordingly, the grooves are formed in the mold to have a pitch of approximately 40 μm and a width of approximately 20 μm without using a conventional cutting tool for cutting each groove. Minute ring electrodes may be easily fabricated by a molding method using the grooves. The image drum manufacturing method may reduce a manufacturing process and a manufacturing cost, thus being very advantageous for mass production.

According to another aspect of the present invention, there is provided an image drum comprising: a core portion inserted into a mold for forming a drum body and formed with a combination groove; a control unit provided inside of the core portion using an FPCB, and a control unit guide having mold grooves corresponding to a plurality of circumferentially formed ring electrodes cut in an inner circumferential surface of the mold.

In this instance, a conductive pattern is printed on a surface of the control unit using the FPCB.

After printing the conductive pattern on the control unit, a control unit guide is provided in an end of the control unit so as to be closely adhered to the conductive pattern. In this instance, since the control unit utilizes the FPCB, bending may occur. However, since the control unit is initially provided with the control unit guide in its end and mounted to the mold, it is possible to prevent distortion, such as bending, of the control unit.

Next, the control unit mounted with the control unit guide is inserted into the combination groove.

Also, the core portion mounted with the control unit is inserted into the hollow of the mold such that ring electrodes correspond to the mold. A drum body is formed to receive the control unit by filling a molten plastic into a space between the mold and the core portion.

In this instance, the control unit may utilize the FPCB and a conductive pattern may be formed in a corresponding location of the control unit to each of the ring electrodes formed of a conductive material. Also, the control unit may utilize a PCB including a plurality of conductive patterns, and the conductive pattern is externally exposed. An insulating layer is formed on the conductive pattern, and connection holes are formed corresponding to ring electrodes formed of a conductive material. In this instance, the conductive pattern may be electrically connected with each ring electrode.

Accordingly, the control unit may more precisely perform an operation of selectively adsorbing toner so as to form an image in a printing apparatus. Also, the drum body may be formed by molding, such as combining the control unit with the combination groove of the core portion and inserting the core portion into the mold. Accordingly, the core portion may be stably received in the drum body, and a manufacturing process may be reduced.

According to still another aspect of the present invention, an image drum manufacturing method provides a hollow cylindrical mold having a plurality of mold grooves circumferentially cut in its inner circumferential surface and a core portion having a smaller diameter than a hollow of the mold and having a slit-shaped combination groove.

Subsequently, a conductive material fills in the mold grooves of the mold. In this instance, the conductive material fills in the hollow of the cylindrical mold and a piston body having an identical diameter to an inside of the hollow passes through the hollow to remove the conductive material except in the mold grooves, and the conductive material remains only in the mold grooves. The diameter of the piston body may be appropriately smaller than the inside diameter of the hollow, thereby ensuring an effective passage through the hollow of the cylindrical mold. However, according to another aspect of the present invention, a method of filling a conductive material only in mold grooves may be utilized according to a designer's preference.

After the above operation, the control unit which individually applies a voltage to each terminal and utilizes a PCB is included. Also, the control unit is inserted into the combination groove such that the control unit is partially exposed to an outside of the core portion.

A drum body is formed to receive the control unit by initially inserting the core portion into the mold and filling a molten plastic into an opening (a space) between the mold and the core portion. After this, an insulating layer is formed on a surface of the control unit.

Connection holes are formed on the insulating layer to correspond to ring electrodes made of a conductive material. The control unit is electrically connected with the ring electrodes via the connection holes. Accordingly, an image drum may be integrally formed with the control unit using a PCB.

BRIEF DESCRIPTION OF THE DRAWINGS

The above and/or other aspects and advantages of the present invention will become apparent and more readily appreciated from the following detailed description, taken in conjunction with the accompanying drawings of which.

DETAILED DESCRIPTION OF EXEMPLARY EMBODIMENTS

Figure 1:
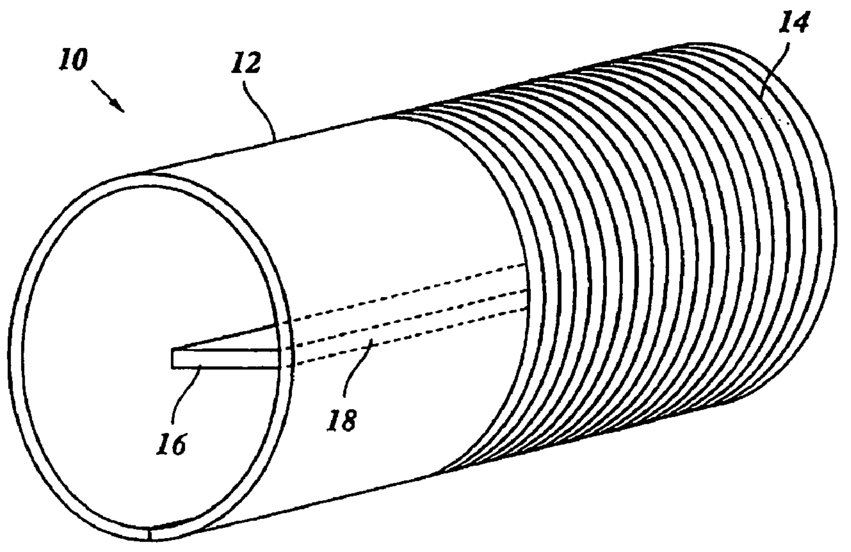
FIG. 1 (CONVENTIONAL ART)
FIG. 1 is a perspective view illustrating a conventional image-forming element according to a conventional art.
Figure 2:
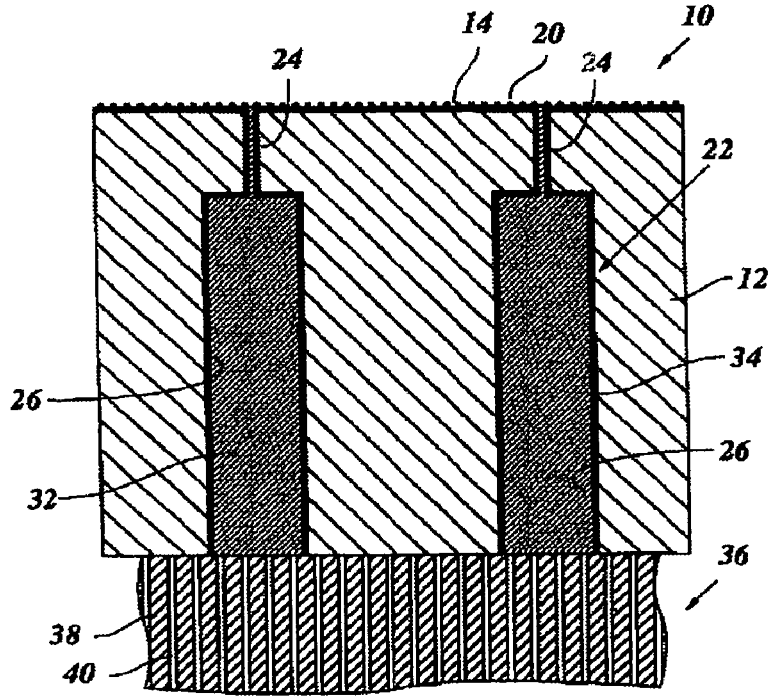
FIG. 2 (CONVENTIONAL ART)
FIG. 2 is a partially enlarged cross-sectional view illustrating a portion of the circumference wall of the conventional image-forming element according to the conventional art.

Reference will now be made in detail to exemplary embodiments of the present invention, examples of which are illustrated in the accompanying drawings, wherein like reference numerals refer to the like elements throughout. The exemplary embodiments are described below in order to explain the present invention by referring to the figures.

Figure 3:
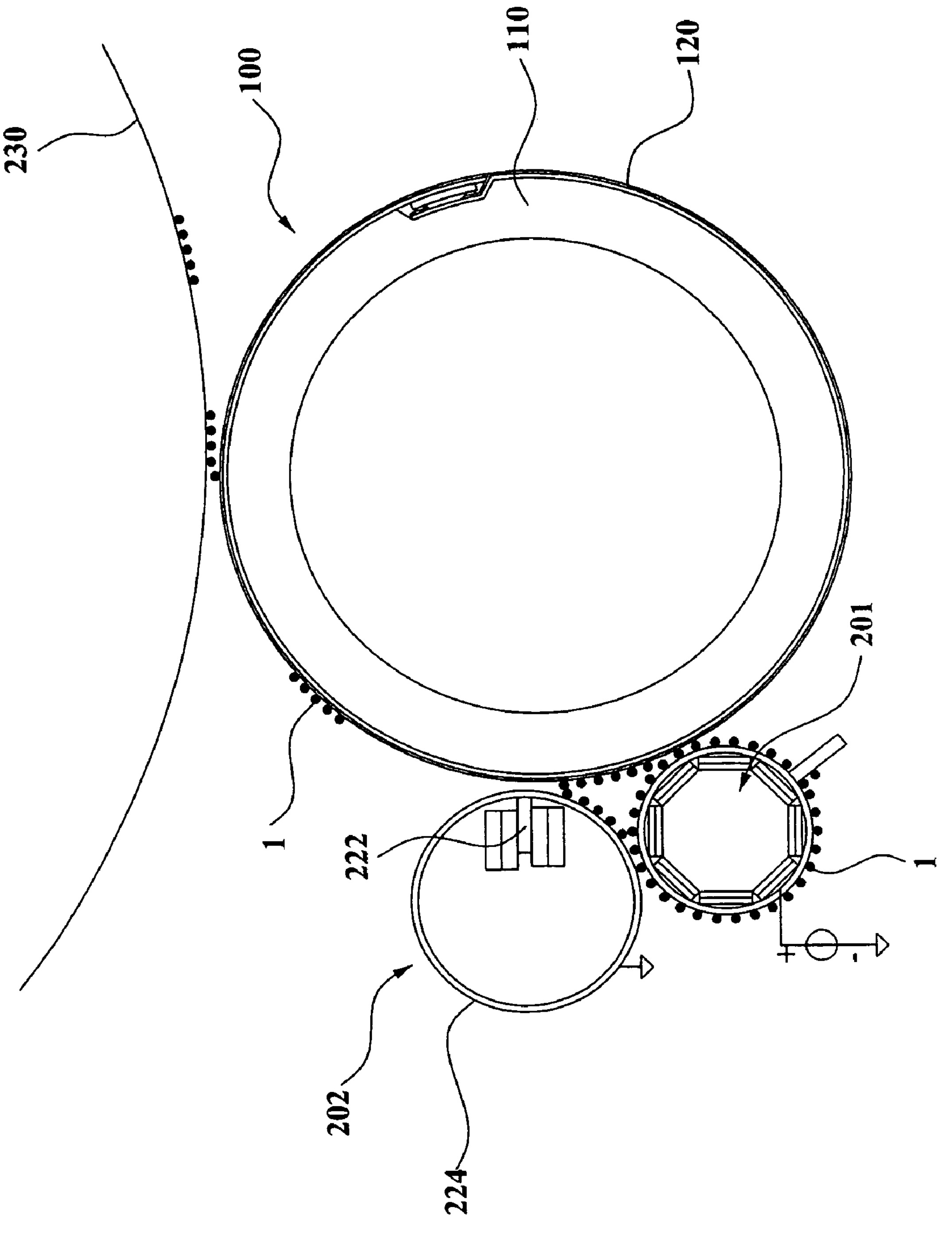
FIG. 3 is a cross-sectional view illustrating the inner construction of a printer using an image drum according to a first exemplary embodiment of the present invention.
Figure 4:
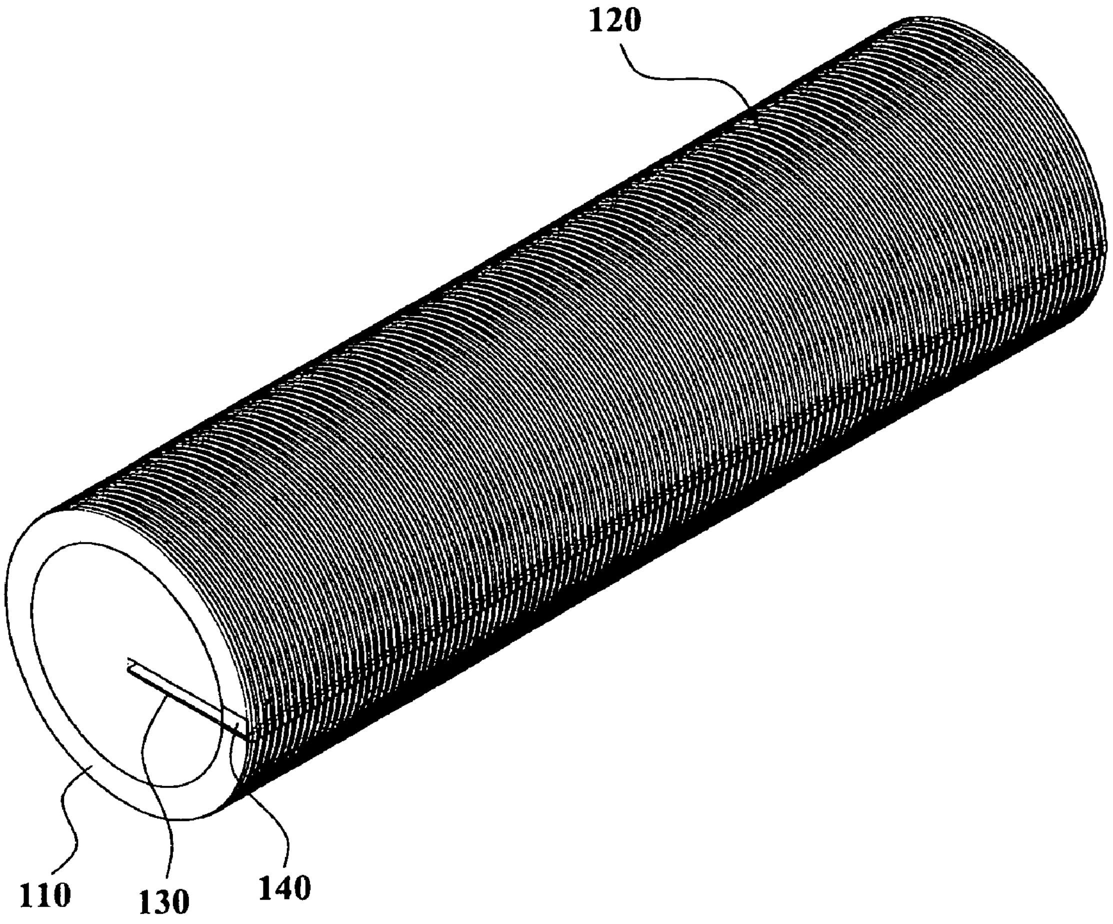
FIG. 4 is a perspective view illustrating the image drum according to the first exemplary embodiment of the present invention.

FIG. 3 is a cross-sectional view illustrating the inner construction of a printer using an image drum according to a first exemplary embodiment of the present invention, and FIG. 4 is a perspective view illustrating the image drum according to the first exemplary embodiment of the present invention.

Referring to FIGS. 3 and 4, the image drum 100 includes a cylindrical drum body 110, ring electrodes 120, a control unit 130 and a control unit guide 140. A toner feed roller 201, a magnetic cutter 202 and an image transfer section 230 are disposed around the outer circumferential surface of the image drum 100. A toner 1 from a toner storage section (not shown) is supplied to the toner feed roller 201. The supplied toner 1 is transferred to the image drum 100 from the toner feed roller 201 while moving on the outer circumferential surface of the toner feed roller 201. In this instance, the toner 1 is kept in an electrically charged state, and is transferred to the magnetic cutter 202 while maintaining a contact with an insulating layer formed on the outermost circumferential portion of the image drum 100.

The magnetic cutter 202 includes a rotary sleeve 224, and a magnet 222 disposed within the magnetic cutter 202 for applying an attraction force to the toner 1. The magnet 222 is positioned adjacent to the image drum 100, and can attract the toner 1 adhered to the surface of the image drum 100 using a magnetic force. The magnet 222 has a sufficient magnetic force which can collect the toner 1 from the electrodes of the image drum 100 which is not applied with a voltage. The toner 1 collected by the magnet 222 is fed back to the toner storage section or the toner feed roller 201 through the rotary sleeve 224.

The toner 1, which is not fed back to the toner storage section or the toner feed roller 201 by the magnetic cutter 202, is transferred to the image transfer section 230 from the outer circumferential surface of the image drum 100. Then, the toner 1 transferred to the image transfer section 230 is moved to a printing paper sheet which is in turn heat-treated so as to allow the toner 1 to be adhered to the surface of the printing paper sheet. The image drum 100 controls the voltage applied to the electrodes to conform to an image signal. Then, the image drum 100 generates an electrostatic force larger than that of the magnet 222 so as to prevent the toner 1 from being collected to the magnetic cutter 202.

Approximately five thousand electrodes are controlled individually so as to represent a two dimensional image on the image drum 100. The image represented on the image drum 100 through the toner 1 can be transferred to the printing paper sheet by using the image transfer section 230 as a relay means. After the toner 1 has been adhered to the surface of the printing paper sheet, the printing paper sheet passes through a heat-treatment apparatus. In this instance, the toner is adsorbed to the surface of the printing paper sheet to complete a corresponding printing.

As shown in FIG. 3, the drum body 110 is formed in a hollow cylindrical shape, and may be formed of a material having excellent heat conductivity and mechanical strength, such as aluminum. Also, ring electrodes 120 may be formed on the outer circumferential surface of the drum body 110. The drum body 110 may be formed of any one selected from the group consisting of poly amid imide (PAI), poly imide (PI), polyacetal (POM), PA, PPO, PPE and polycarbonate (PC). Also, in another exemplary embodiment of the present invention, the drum body may be manufactured by using an engineering plastic according to a designer's preference.

A plurality of ring electrodes 120 are integrally formed with the drum body 110 on the outer circumferential surface thereof by injection molding and electrically insulated from each other. Since the ring electrodes 120 can be formed by patterning copper or other thin conductive film in a flat state, a groove cutting process or a conductive material filling process employed in a conventional image drum manufacturing method may be eliminated in the present embodiment. First of all, since it is possible to form the ring electrodes 120 on the outer circumferential surface of the drum body 110 by injection molding, the level of work and difficulty are greatly reduced, as compared to forming the ring electrodes 120 on the outer circumferential surface of the cylindrical drum body 110. The defective generation rate of the ring electrodes 120 can be remarkably reduced.

The control unit 130 is fixed on the drum body 110 so as to be electrically connected with the ring electrodes 120 and individually applies a voltage to each of the ring electrodes 120. Conductive patterns may be formed on a top surface of the control unit 130. The conductive patterns are evenly formed as ring electrodes 120 to have a pitch of below approximately 40 μm and a width of approximately 20 μm. The ring electrodes 120 covering the circumference of the drum body 110 are formed to have a width corresponding to the printing width of the printing paper sheet. As an example, assuming the printing paper sheet of A4 size, the drum body 110 is formed to have a length of at least 20 to 22 cm over the whole width thereof. At this time, each ring electrode 120 may be formed to have a pitch of approximately 40 μm to achieve about five thousand lines. Also, the ring electrodes 120 are arranged in parallel with each other and formed in a ring structure which is closed as one piece or partially opened. The control unit 130 may utilize an FPCB. Also, in another exemplary embodiment of the present invention, the control unit 130 may utilize a PCB according to a designer's preference.

FIGS. 5 to 11 are views illustrating a method of manufacturing the image drum according to the first exemplary embodiment of the present invention.

Figure 5:
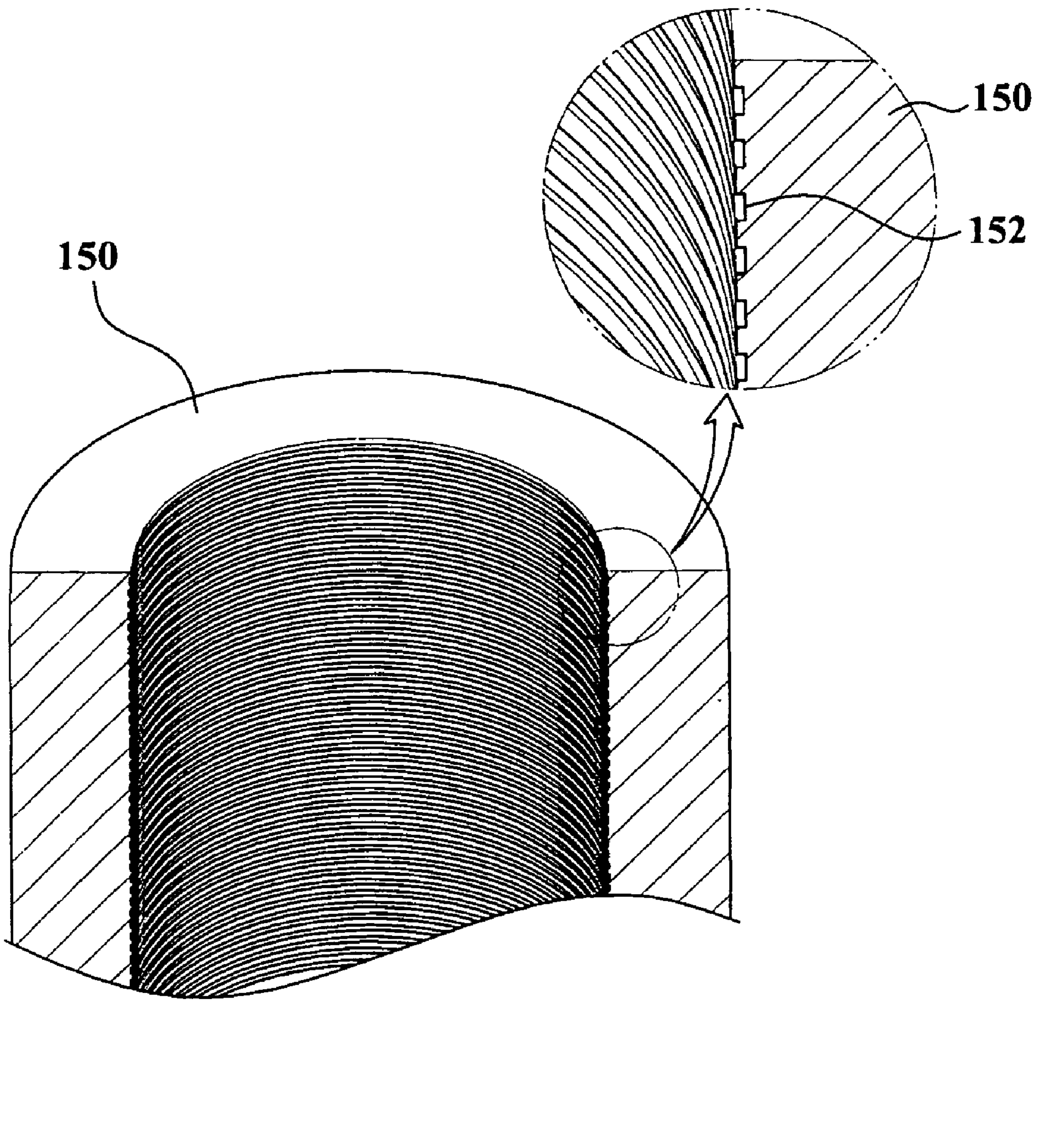
FIGS. 5 to 11 are views illustrating a method of manufacturing the image drum according to the first exemplary embodiment of the present invention.

Referring to FIG. 5, a hollow cylindrical mold 150 having a plurality of mold grooves 152 circumferentially cut in its inner circumferential surface is provided. The mold grooves 152 are arranged in parallel with each other at regular intervals and cut to have an identical thickness. Also, a conductive material fills in the hollow of the mold 150. In the present exemplary embodiment, the mold grooves 152 are formed to have a width of approximately 20 μm and a pitch of approximately 40 μm, so as to achieve about five thousand lines.

Figure 6:
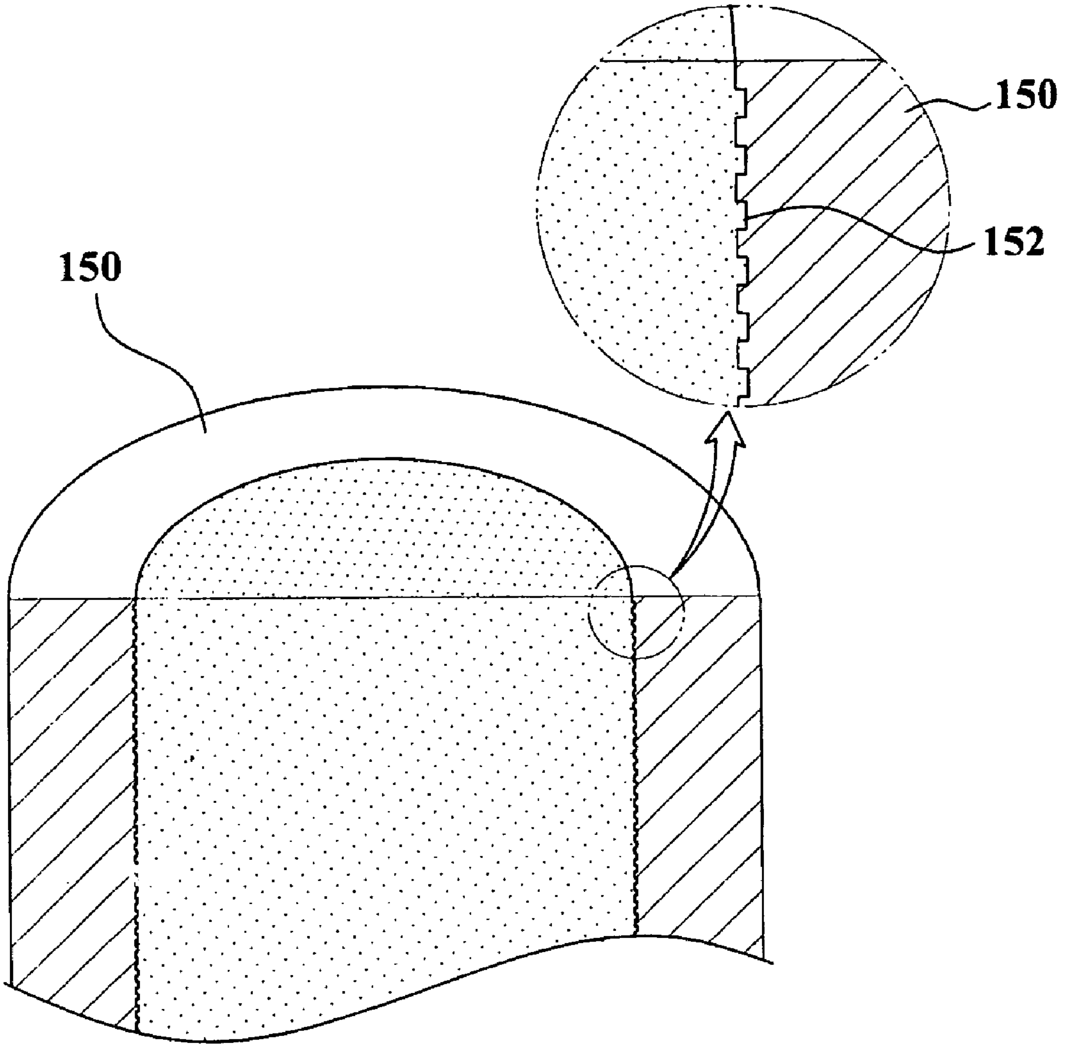

Referring to FIG. 6, a conductive material using a silver paste or a conductive polymer fills in both the hollow of the mold 150 and the mold grooves 152. In this instance, a diameter of the hollow of the mold 150 may be determined on the basis of a diameter of the drum body 110. By utilizing the manufacturing method of the present exemplary embodiment to fabricate the mold 150, mass production is possible.

Figure 7:
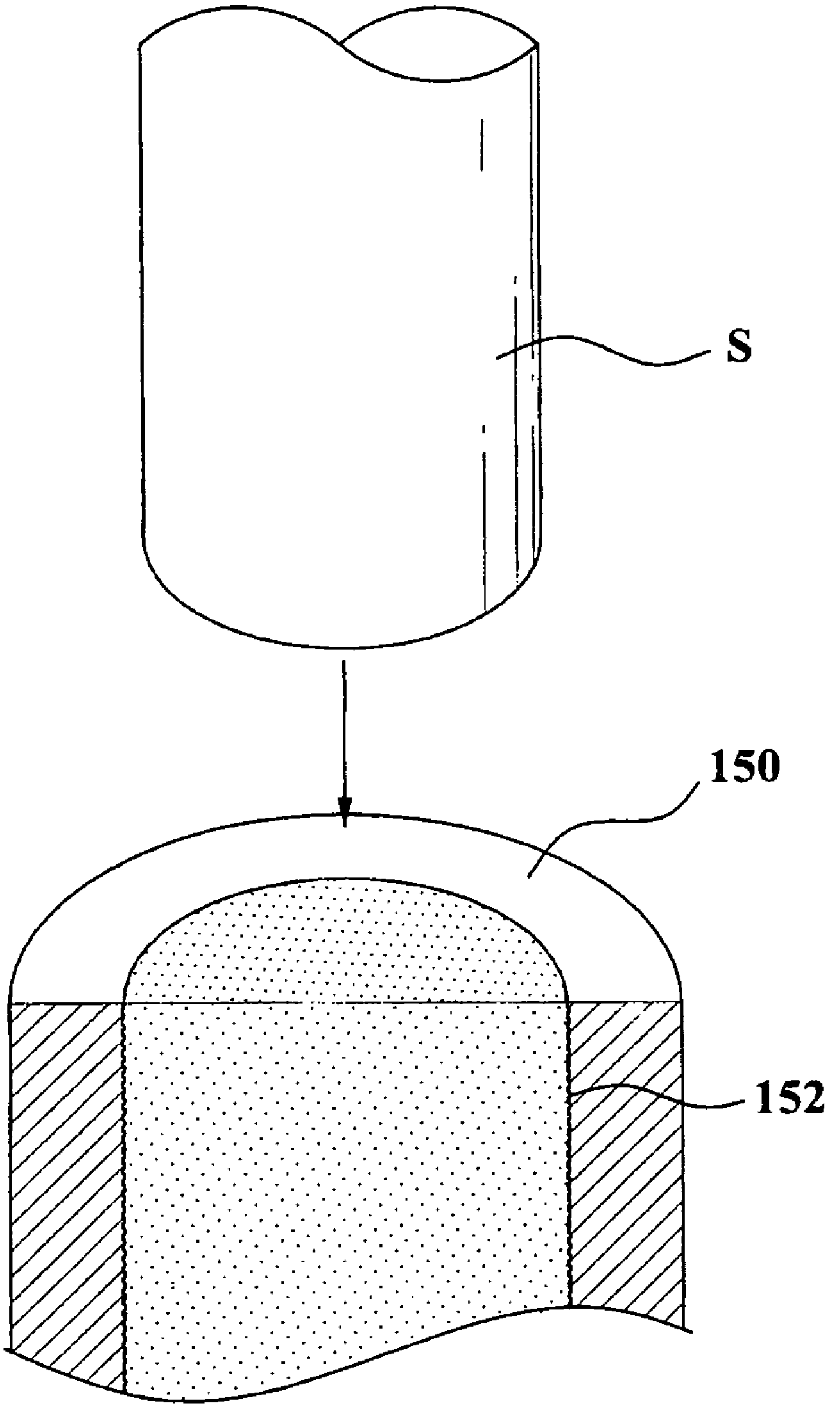

Referring to FIG. 7, after filling a conductive material into the mold 150, a piston body S passes through the hollow of the mold 150 from the outside of mold 150. In this instance, the piston body S may be fabricated to have a diameter fitting a diameter of the hollow of the mold 150.

Figure 8:
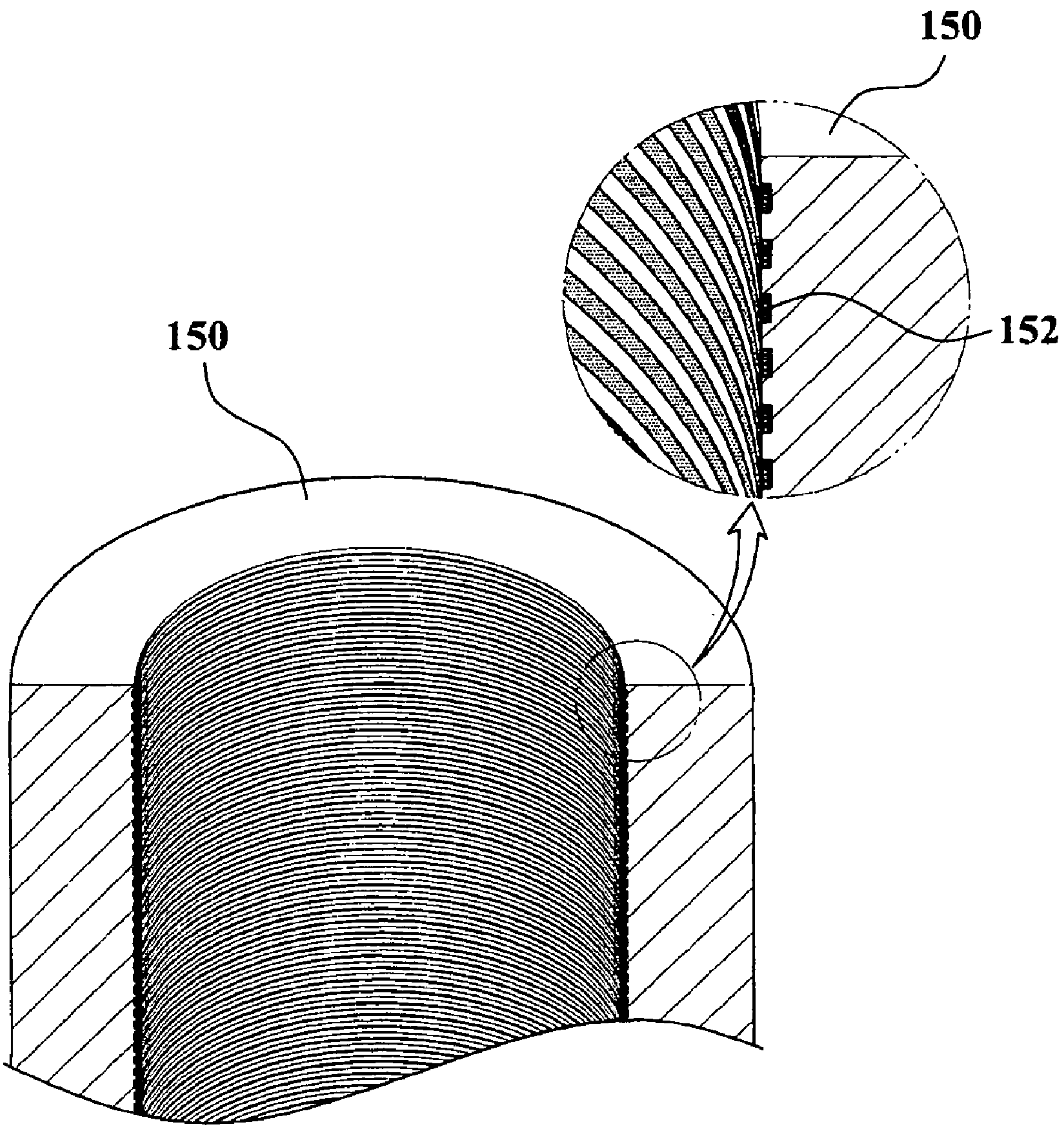

Referring to FIG. 8, after the piston body S passes through the hollow of the mold 150, the conductive material remaining in the hollow of the mold is removed to the outside of mold 150, which allows the conductive materials to remain only in the mold grooves 152. Through this process, the ring electrodes 120 are integrally formed on the outer circumferential surface of the drum body 110. Accordingly, unlike in the conventional art, all of the ring electrodes 120 may be formed on the outer circumferential surface of the drum body 110 at one time, without individually forming each ring electrode on the circumference of the drum body 110.

Figure 9:
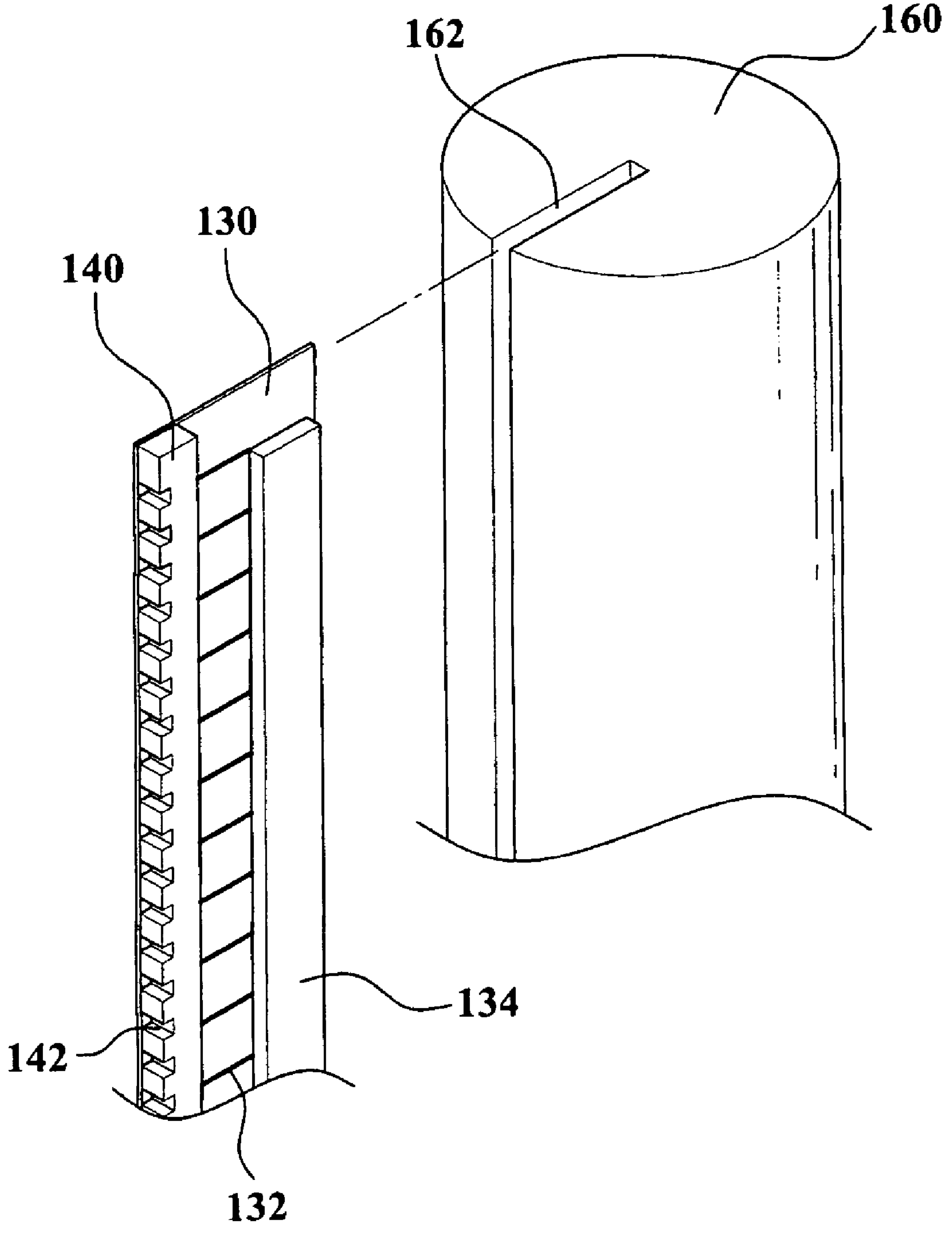

Referring to FIG. 9, a core portion 160 is provided. The core portion 160 has a smaller diameter than the hollow of the mold 150 and has a slit-shaped combination groove 162. The difference in diameter between the mold 150 and the core portion 160 is designed to fit the core portion 160 into a diameter of the drum body 110. Also, the combination groove 162 has a groove into which the control unit 130 may be inserted.

A control unit guide 140 is provided in an end of the control unit 130. A conductive pattern 132 is formed in a corresponding position to each receiving groove 142 of the control unit guide 140. Also, a control section 134 may be formed to control an electrical signal in each conductive pattern 132. The control unit guide 140 is formed with receiving grooves 142 corresponding to the mold grooves 152. In this instance, by disposing the receiving grooves 142 in an identical position to the mold grooves 152 and filling a conductive material in the receiving grooves 142, the control unit guide 140 is electrically connected to the ring electrodes 134.

Figure 10:
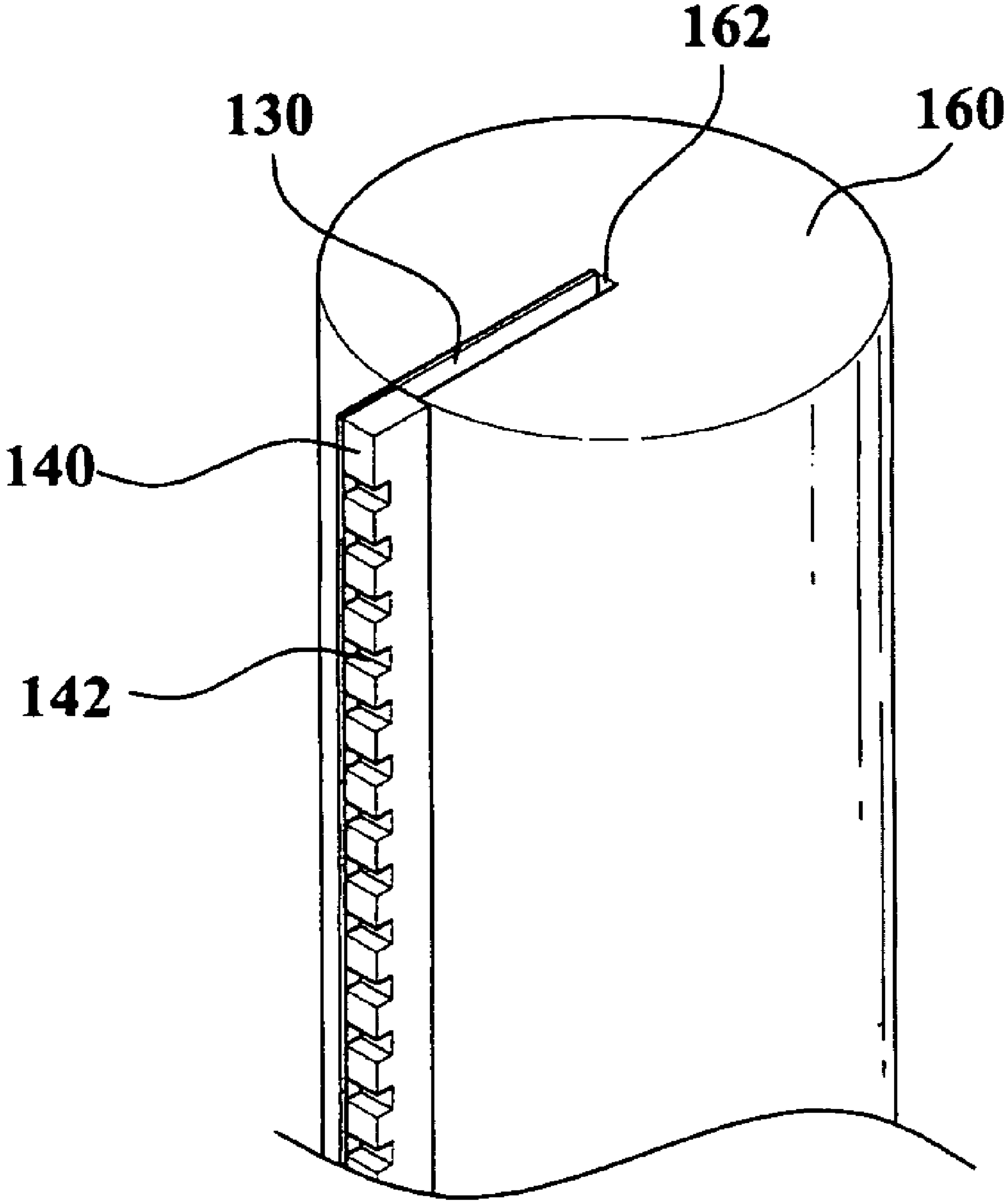

Referring to FIG. 10, the control unit 130 is inserted into the combination groove 162 of the core portion 160. By inserting the control unit 130, a portion of the control unit 130 is received in the core portion 160 and another portion of the control unit 130 is externally exposed. The control unit guide 140 is mounted to the externally exposed portion of the control unit 130, which prevents the control unit 130, using an FPCB, from bending or being deformed.

Figure 11:
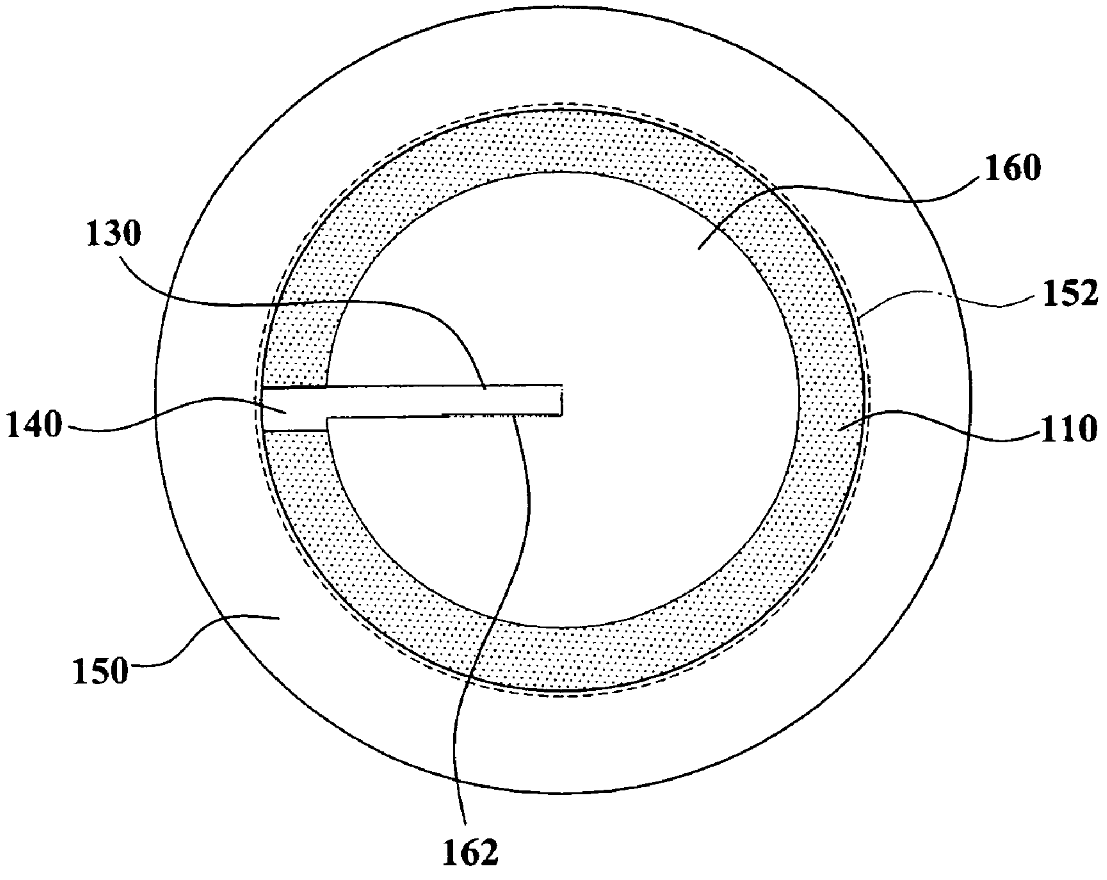

Referring to FIG. 11, when the core portion 160 coupled with the control unit 130 in its combination groove 162 is inserted into the hollow of the mold 150, and the core portion 160 is disposed in the center of the mold 150, a mold opening (space) is provided between the mold 150 and the core portion 160. The drum body 110 is formed by filling a molten plastic in the mold opening (space). Accordingly, the control unit 130 is automatically received in the drum body 110.

An image drum and an image drum manufacturing method according to the present exemplary embodiment utilizes a method of forming the ring electrodes 120 by filling a conductive material in the mold grooves 152 which are formed in the mold 150 and forming the ring electrodes 120 on the outer circumferential surface of the drum body 110. Namely, the ring electrodes 120 may be integrally formed with the conductive material filled into the mold grooves 152. As a result, all the minute ring electrodes 120 may be formed on the outer circumferential surface of the drum body 110 at once by injection molding. Indeed, according to the present exemplary embodiment, it is not necessary to cut each groove by using a conventional cutting tool, and the ring electrodes 120 are formed by using a molding method in the mold 150. Accordingly, the manufacturing process and cost are reduced.

Also, the control unit 130 may more precisely perform a process of controlling the ring electrodes 120 to selectively adsorb a toner so as to form an image in a printing apparatus. The drum body 110 is formed by molding, that is, by initially inserting the control unit 130 into the combination groove 162 of the core portion 160 and subsequently inserting the core portion 160 into the mold 150. Accordingly, the core portion 160 may be stably received in the drum body 110. Also, a manufacturing process may be reduced.

Figure 12:
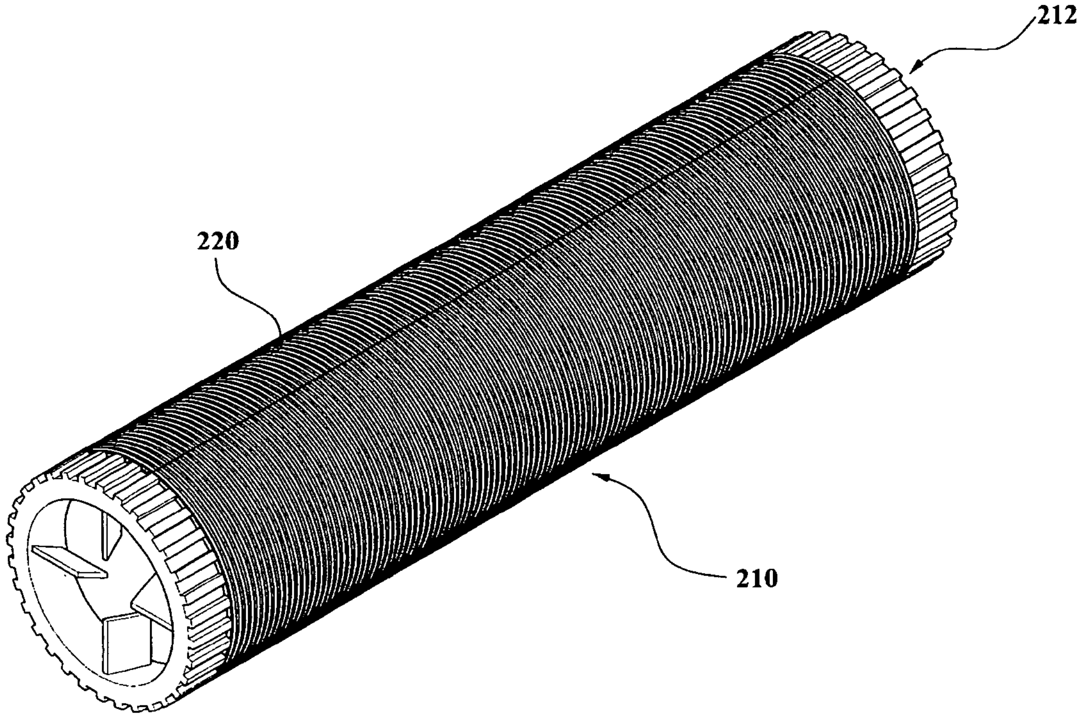
FIG. 12 is a perspective view illustrating an image drum according to a second exemplary embodiment of the present invention.
Figure 13:
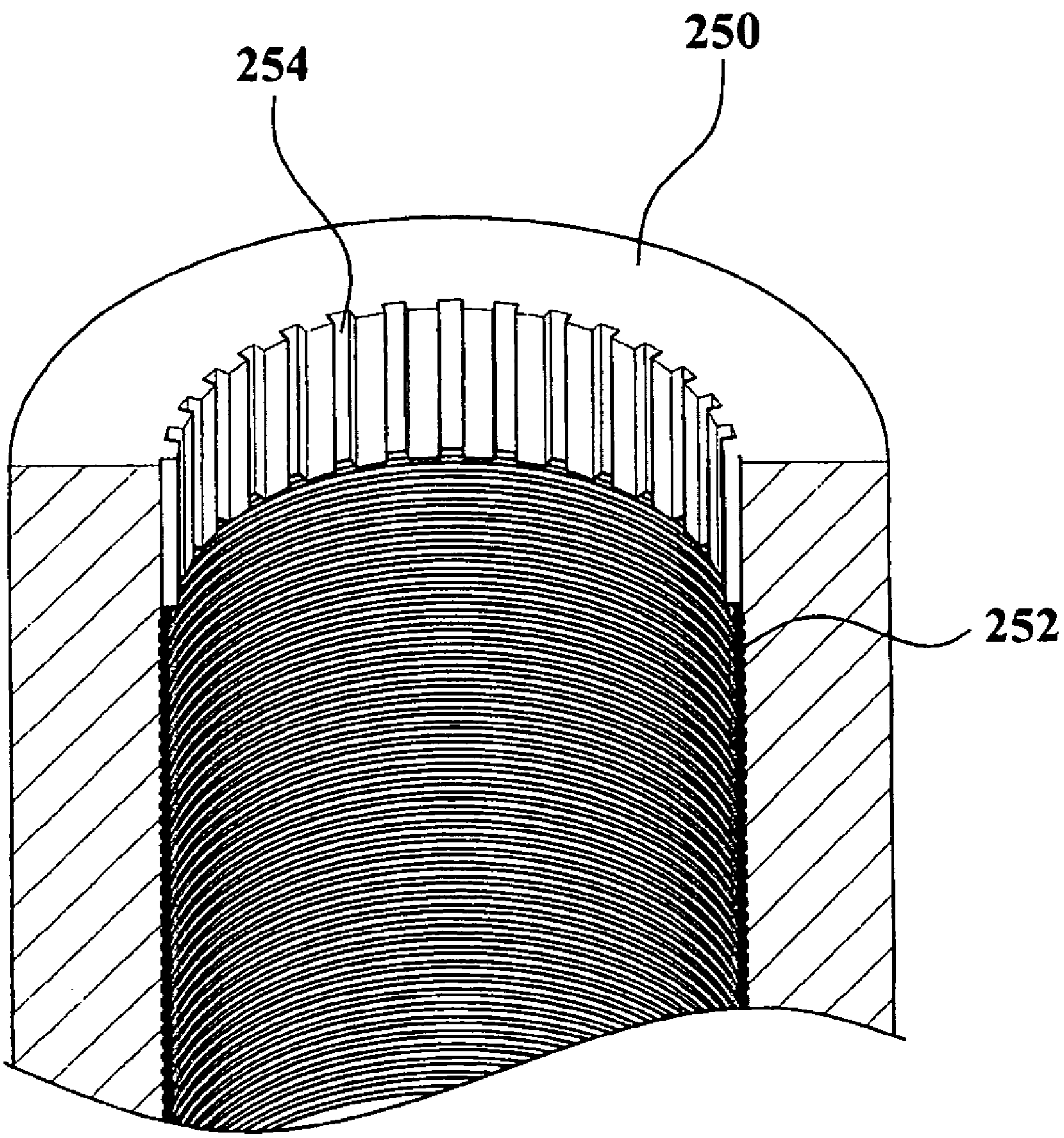
FIG. 13 is a cross-sectional view illustrating the mold shown in FIG. 12.

FIG. 12 is a perspective view illustrating an image drum according to a second exemplary embodiment of the present invention, and FIG. 13 is a cross-sectional view illustrating the mold shown in FIG. 12.

Referring to FIGS. 12 and 13, an image drum includes a drum body 210 and ring electrodes 220.

A gear 212 is integrally formed in each end of the drum body 210. The gear 212 is combined with an external gear. As the external gear rotates, the gear 212 also rotates. Accordingly, a supplied toner is transferred to the image drum from a toner feed roller while moving on the circumferential surface of the toner feed roller.

Referring to FIG. 13, a mold 250 for fabricating the drum body 210 is provided. A mold space 254 in an identical shape to the gear 212 is provided on an upper portion of the mold 250, so as to integrally form the gear 212 in each end of the drum body 210. The drum body 210 and the gear 212 are integrally formed by filling a molding material into the hollow of the mold 250. However, in another exemplary embodiment of the present invention, according to a designer's preference, a gear may be initially formed and subsequently assembled to a drum body.

Figure 14:
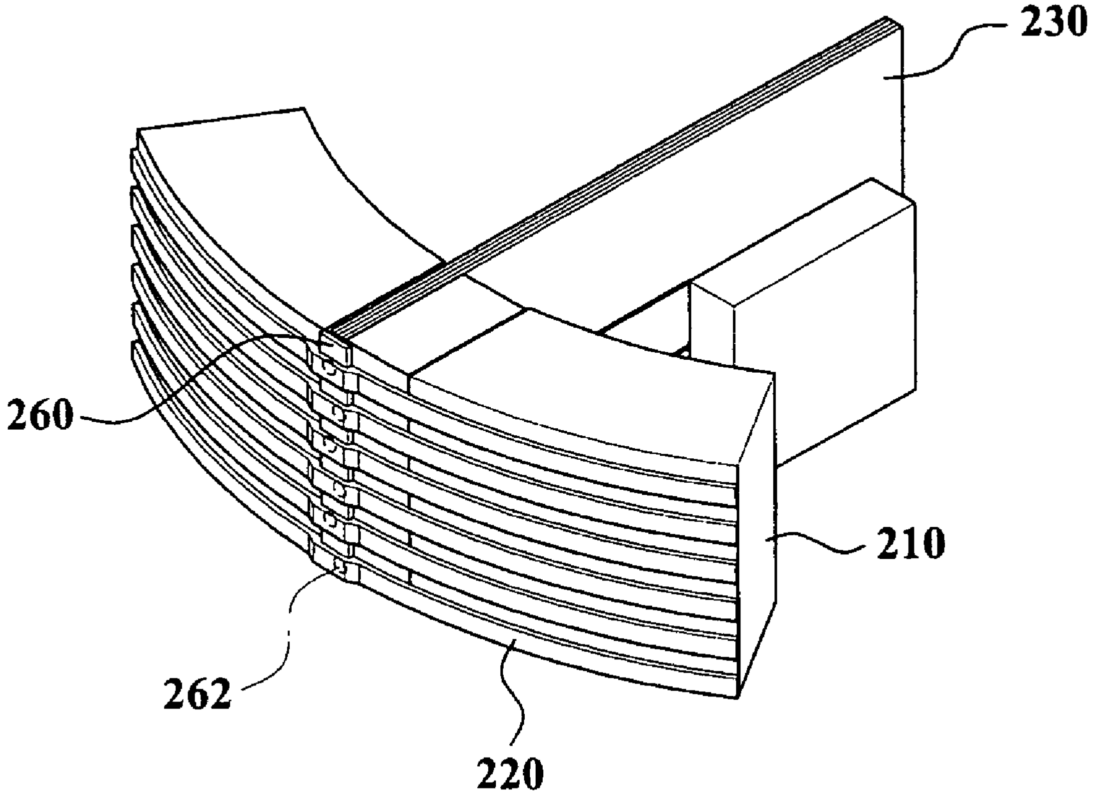
FIG. 14 is a partially enlarged perspective view illustrating an image drum manufacturing method according to the second exemplary embodiment of the present invention.
Figure 15:
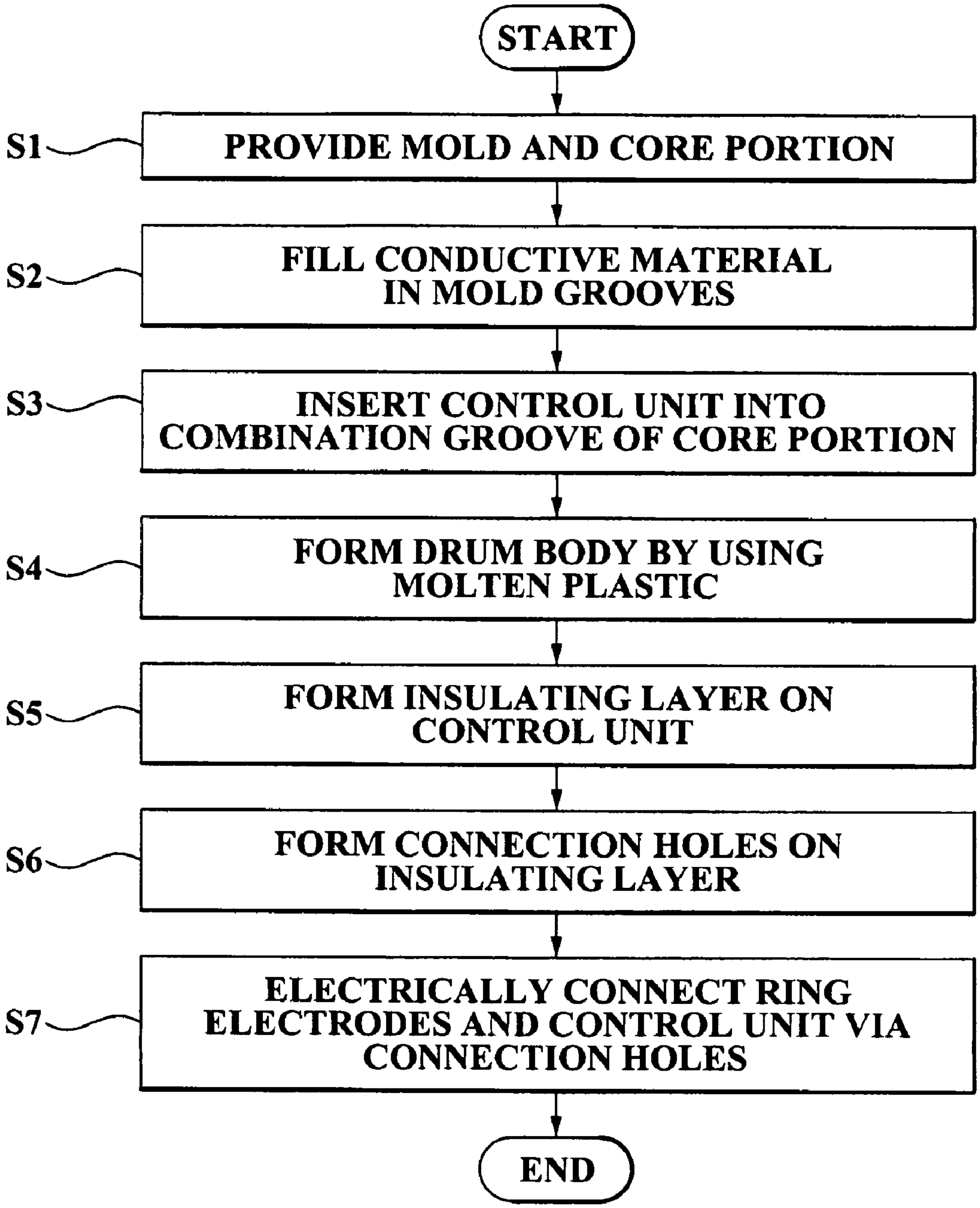
FIG. 15 is a flowchart illustrating the image drum manufacturing method according to the second exemplary embodiment.

FIG. 14 is a partially enlarged perspective view illustrating an image drum manufacturing method according to the second exemplary embodiment of the present invention, and FIG. 15 is a flowchart illustrating the image drum manufacturing method according to the second exemplary embodiment.

Referring to FIGS. 14 and 15, in operation S1, a hollow cylindrical mold and a core portion are provided. In this instance, the hollow cylindrical mold has a plurality of mold grooves circumferentially cut in its inner circumferential surface, and the core portion has a smaller diameter than a hollow of the mold and has a slit-shaped combination groove provided therein.

In operation S2, a conductive material fills in the mold grooves of the mold respectively. Specifically, the conductive material fills in the hollow of the cylindrical mold by applying the conductive material. By passing a piston body having an identical diameter to an inside diameter of the hollow so as to remove the conductive material except in the mold grooves, only the conductive material remains in the mold grooves. Particularly, the diameter of the piston body should be a suitable size to appropriately fit the hollow of the cylindrical mold, so that the conductive material is only left in the mold grooves after passing through the hollow.

In operation S3, a control unit, individually applying a voltage to each terminal and using a PCB, is included and inserted into the combination groove to be partially exposed to an outside of the core portion. Additionally, a conductive pattern is formed on the control unit to be electrically connected with each ring electrode and a control section is provided in the control unit so as to transfer an electrical signal to the conductive pattern. The control unit using a PCB is fabricated into a single unit by layering a plurality of PCBs so that conductive patterns cross each other.

In operation S4, a drum body receiving the control unit is formed by initially inserting the core portion into the mold and filling a molten plastic into a space between the mold and the core portion. In this instance, the drum body is manufactured in the shape of a hollow by removing the core portion, except the control unit, from the drum body.

In operation S5, a conductive pattern is formed to be extended in a longitudinal direction of the control unit and an insulating layer is formed on a surface of the control unit. Each ring electrode contacts with only one conductive pattern.

As illustrated in FIG. 14, in operation S6, connection holes 262 are formed on an insulating layer 260 to correspond to ring electrodes 220 made of a conductive material. Also, in operation S7, the connection holes 262 are formed to correspond to the ring electrodes 220 respectively. The ring electrodes 220 and the control unit are electrically connected via the connection holes 262.

An image drum manufacturing method according to the present exemplary embodiment may integrally form the gears 212 in both ends of the drum body 210 by injection molding. Accordingly, a manufacturing process may be reduced. Also, since the control unit may utilize a PCB or an FPCB, the control unit may be integrally formed with the drum body 210, when forming the drum body 210 in the mold by injection molding.

A drum body, ring electrodes and a control unit are substantially identical to the first exemplary embodiment, and functions and effects of configuration elements are also substantially identical to the first exemplary embodiment. Therefore, the description and drawings described in the previous exemplary embodiment may be referred to, and repeated description will be omitted herein.

As described above, an image drum and an image drum manufacturing method according to the present invention form ring electrodes by filling a conductive material in mold grooves formed in the inner circumferential surface of a mold. Namely, ring electrodes are easily formed by injection molding, without cutting each groove using a conventional cutting tool. Accordingly, it is possible to reduce the manufacturing process and cost when practicing the present invention.

Also, according to the present invention, a control unit may more precisely perform a process of controlling the ring electrodes 120 to selectively adsorb toner so as to form an image in a printing apparatus. Since a drum body is fabricated through injection molding by initially coupling the control unit with a combination groove and inserting a core portion into a mold, the conventional assembling process is eliminated to reduce the manufacturing process.

Further, an image drum manufacturing method according to the present invention may integrally form gears in both ends of a drum body by injection molding. Accordingly, a manufacturing process may be reduced.

Although a few exemplary embodiments of the present invention have been shown and described, the present invention is not limited to the described embodiments. Instead, it would be appreciated by those skilled in the art that changes may be made to these exemplary embodiments without departing from the principles and spirit of the invention, the scope of which is defined by the claims and their equivalents.

What is claimed is:

1. A method of manufacturing an image drum for selectively adsorbing a toner thereon so as to form an image in a printing apparatus, the method comprising:

providing a hollow cylindrical mold having a plurality of mold grooves circumferentially cut in its inner circumferential surface;

providing a core portion having a smaller diameter than a hollow of the mold and having a slit-shaped combination groove;

filling a conductive material into the plurality of mold grooves, respectively, of the mold;

inserting a control unit for individually applying a voltage to each terminal in the combination groove of the core portion, so that a conductive pattern corresponding to the conductive material is partially exposed;

inserting the core portion into the mold so that the conductive pattern corresponds to the conductive material filled into each one of the plurality mold grooves; and forming a drum body to be integrally formed with the control unit and the conductive material, by filling a molten plastic into an opening between the mold and the core portion.

2. The method of claim 1, wherein, in the filling of the conductive material, the conductive material fills in the hollow of the cylindrical mold by applying the conductive material and passing a piston body having an identical diameter to an inside diameter of the hollow so as to remove the conductive material except in the mold grooves.

3. The method of claim 1, wherein the control unit utilizes a flexible printed circuit board (FPCB), and the conductive pattern corresponding to ring electrodes formed of the conductive material is provided on a surface of the control unit.

4. The method of claim 3, wherein a control unit guide is formed in an end portion of the control unit, and the core portion mounted with the control unit guide is inserted into the mold.

5. The method of claim 4, wherein receiving grooves corresponding to the plurality of mold grooves are formed in the control unit guide and the control unit guide is electrically connected with the ring electrodes by initially disposing the receiving grooves in a same position as the plurality of mold grooves and filling the conductive material in the receiving grooves.

6. The method of claim 1, wherein the control unit utilizes a printed circuit board (PCB) including the conductive pattern, and the PCB electrically connects the conductive pattern with the ring electrodes by externally exposing the conductive pattern, forming an insulating layer on the conductive pattern and providing connection holes on the insulating layer so as to correspond to the ring electrodes formed from the conductive material.

7. The method of claim 6, wherein the drum body is manufactured in the shape of a hollow by removing the core portion, except the control unit, from the drum body.

8. The method of claim 1, wherein a mold space, in a shape of a gear, is provided in each end of the mold to be combined with an external gear for rotating the drum body, and the gear is integrally formed in each end of the drum body by filling the molten plastic into the mold space.

9. The method of claim 1, wherein the core portion is inserted into the mold so that the control unit contacts the conductive material filled into the mold grooves.

10. A method of manufacturing an image drum for selectively adsorbing a toner thereon so as to form an image in a printing apparatus, the method comprising:
- providing a hollow cylindrical mold having a plurality of mold grooves circumferentially cut in its inner circumferential surface;
- providing a core portion inserted into the mold and having a combination groove in a longitudinal direction;
- providing a control unit provided inside of the core portion and utilizing an FPCB;
- filling a conductive material into the plurality of mold grooves of the mold;
- providing a control unit guide in an end of the control unit;
- inserting the control unit mounted with the control unit guide into the combination groove;
- inserting the core portion mounted with the control unit into the hollow of the mold; and
- forming a drum body to be integrally formed with the control unit and the conductive material, by filling a molten plastic in an opening between the mold and the core portion.

11. The method of claim 10, wherein the plurality of mold grooves corresponding to a plurality of ring electrodes circumferentially formed in an inner circumferential surface of the mold are formed in the control unit guide and filled with the conductive material to be electrically connected with the plurality of ring electrodes.

12. The method of claim 10, wherein a mold space, in a shape of a gear, is provided in each end of the mold to be combined with an external gear, and the gear is integrally formed in each end of the drum body by filling the molten plastic into the mold space.

13. A method of manufacturing an image drum for selectively adsorbing a toner thereon so as to form an image in a printing apparatus, the method comprising:
- providing a hollow cylindrical mold having a plurality of mold grooves circumferentially cut in its inner circumferential surface;
- providing a core portion having a smaller diameter than a hollow of the mold, and having a slit-shaped combination groove;
- filling a conductive material into the plurality of mold grooves of the mold;
- including a control unit which individually applies a voltage to each terminal of a plurality of terminals and is formed by using a PCB;
- combining the control unit into the combination groove, so that the control unit is partially exposed from an outside of the core portion;
- forming a drum body to be integrally formed with the control unit and the conductive material, by initially inserting the core portion into the hollow of the mold and filling a molten plastic into a space between the mold and the core portion;
- forming an insulating layer in a portion of the mold to contact a surface of the control unit;
- forming a connection hole which corresponds to each ring electrode of a plurality of ring electrodes formed in the drum body, on the insulating layer; and
- electrically connecting each ring electrode of the plurality of ring electrodes and the control unit via the connection hole.

14. The method of claim 13, further comprising manufacturing the cylindrical drum body in the shape of a hollow by removing the core portion, except the control unit, from the drum body.

* * * * *